United States Patent [19]
Tamaru et al.

[11] Patent Number: 6,055,176
[45] Date of Patent: Apr. 25, 2000

[54] MEMORY DEVICE WITH PROCESSING FUNCTION

[75] Inventors: Keikichi Tamaru; Hiroshi Nozawa, both of Uji; Yoshiro Fujii, Kameoka; Akira Kamisawa, Ukyo-ku, all of Japan

[73] Assignee: Rohm Co., Ltd., Kyoto, Japan

[21] Appl. No.: 09/268,972

[22] Filed: Mar. 16, 1999

Related U.S. Application Data

[63] Continuation of application No. PCT/JP98/03220, Jul. 17, 1998.

[30] Foreign Application Priority Data

Jul. 18, 1997 [JP] Japan ................................. 9-193828

[51] Int. Cl.[7] .................................................. G11C 11/22
[52] U.S. Cl. ...................... 365/145; 365/149; 365/189.04
[58] Field of Search .................................... 365/145, 149, 365/189.04, 189.05

[56] References Cited

U.S. PATENT DOCUMENTS

| | | | |
|---|---|---|---|
| 4,914,627 | 4/1990 | Eaton, Jr. et al. | 365/145 |
| 5,010,518 | 4/1991 | Toda | 365/145 |
| 5,608,667 | 3/1997 | Osawa | 365/145 |
| 5,726,930 | 3/1998 | Hasegawa et al. | 365/145 |
| 5,844,831 | 12/1998 | Nishimura | 365/145 |

FOREIGN PATENT DOCUMENTS

| | | |
|---|---|---|
| 63-228498 | 9/1988 | Japan . |
| 4-182984 | 6/1992 | Japan . |
| 4-298884 | 10/1992 | Japan . |
| 6-215560 | 8/1994 | Japan . |
| 6-342597 | 12/1994 | Japan . |
| 8-129376 | 5/1996 | Japan . |
| 8-203276 | 8/1996 | Japan . |
| 10-149675 | 6/1998 | Japan . |

*Primary Examiner*—David Nelms
*Assistant Examiner*—Tuan T. Nguyen
*Attorney, Agent, or Firm*—Merchant & Gould P.C.

[57] ABSTRACT

It is an object of the present invention to provide a memory device with processing function using less transistors, and capable of operating with simple operation and allows its operation with less trouble. Each of W cells 34 includes a ferroelectric capacitor CF. One end 40 of the ferroelectric capacitor CF is connected to one of data lines D through a transistor T1. The one end 40 of the ferroelectric capacitor CF is connected to an inner data line MW through a transistor T2. The structure of the Q cells 36 is almost the same as that of the W cells 34. Both readout/writing operations of data from the outside of the device are performed by using the data line D. Data read out from both the W cell 34 and the Q cell 36 is sent to the adder 28 and added thereby, and the resultant data of the addition is written to the Q cell 36 through a buffer circuit 32. The memory device with processing function can be realized with a simple structure by using ferroelectric capacitors CF.

20 Claims, 10 Drawing Sheets

DATA WRITING FROM THE OUTSIDE

DATA READOUT TO THE OUTSIDE

DATA READOUT WHEN PERFROMING ADDITION (W)

DATA READOUT WHEN PERFROMING ADDITION (Q)

WRITING RESULTANT DATA

MEMORY DEVICE WITH PROCESSING FUNCTION

"This application is a continuation of international application No. PCT/JP98/03220, filed Jul. 17, 1998."

CROSS-REFERENCE TO RELATED APPLICATION

The entire disclosure of Japanese Patent Application No. Hei 9-193828 filed on Jul. 18, 1997 including specification, claims, drawings and abstract is incorporated herein by reference in its entirety.

1. Field of the Invention

This invention relates to a memory device, more specifically to a memory device including memory elements each storing data and internal data processing means performing predetermined processings to the stored data.

2. Background of the Invention

A memory device with processing function is used for performing processing of images and other data. The memory device with processing function conducts not only data storing but also performs brief processing to the stored data. For example, some memory devices with processing function have memory cells each storing data for a plurality of words as well as having processing circuits for each of the stored words. By using the memory devices with processing function, the stored data which form the words can be processed in parallel manner with the processing circuits installed therein without using an input/output circuit (I/O circuit) as well as the main processor existing externally. In this way, a large amount of data stored therein can be processed at a high speed. As a result, no strict restrictions to other processings by carrying out processing of image data are observed in the main processor because the workload of the main processor is reduced remarkably.

The prior art memory devices with processing function, however, have the following problems to be solved. A plurality of dynamic random access memories (hereinafter referred to as DRAMs) are used as the memory cells in the prior art memory devices in order to reduce its area. Many transistors, wirings connecting therebetween as well as complicated operation are required by using the DRAMs requiring a specific operation so called "refreshing" and related thereto. Further, all the data under processing could be erased undesirably when the power supply is in a trouble because the DRAMs are volatile memories.

SUMMARY OF THE INVENTION

It is an object of the present invention to overcome the above-mentioned drawbacks of the memory devices with processing function associated with the prior arts, and to provide a memory device with processing function using less transistors, capable of operating with much simpler operation and allowing its operation with less trouble.

In accordance with characteristics of the present invention, there is provided a memory device with processing function, the memory device comprises:

a memory element for storing data, and internal data processing means for performing a desired processing to the data stored in the memory element, wherein a ferroelectric memory element which stores data by using hysteresis characteristics of ferroelectrics is used as the memory element.

While the novel features of the invention are set forth in a general fashion, both as to organization and content, the invention will be better understood and appreciated, along with other objects and features thereof from the following detailed description taken in conjunction with the drawings.

DETAILED DESCRIPTION OF THE PREFERRED EMBODIMENT

Figure 1:
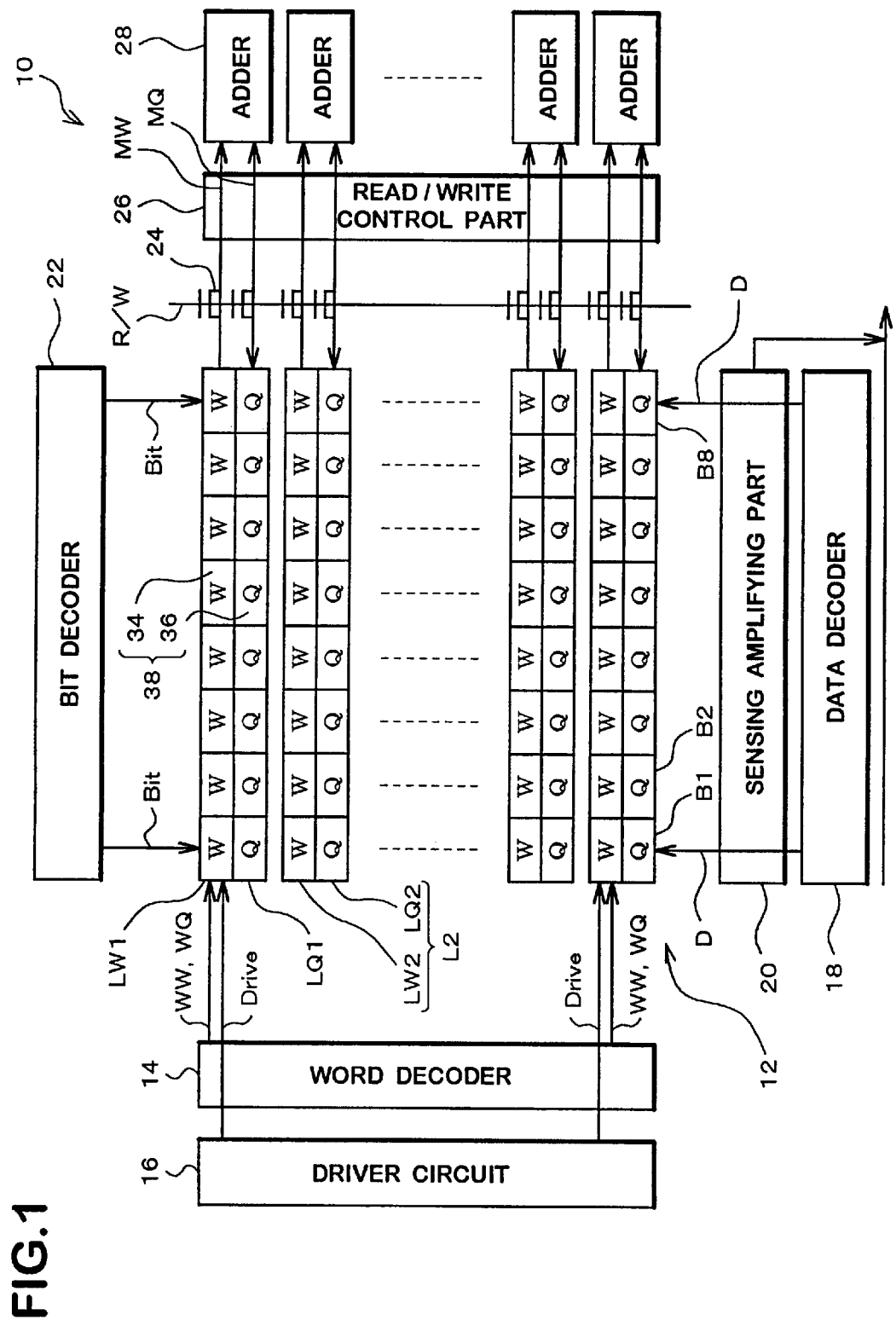
FIG. 1 is a diagram showing an overall structure of a functional memory 10 as an example of a memory device with processing function according to the present invention.

FIG. 1 depicts a diagram showing an overall structure of a functional memory 10 as an embodiment of a memory device with processing function according to the present invention. The functional memory 10 includes a cell matrix portion 12, a word decoder 14, a driver circuit 16, a data decoder 18, a sensing amplifying part 20, a bit decoder 22, a plurality of transistors 24 forming read/write state switching means, a read/write control part 26 and a plurality of adders 28 forming internal data processing means.

Within the cell matrix portion 12, W cells 34 forming first memory elements and Q cells 36 functioning as second memory elements are arranged in a matrix format. Rows consist of the W cells 34 and the Q cells 36 are arranged alternately.

Figure 2:
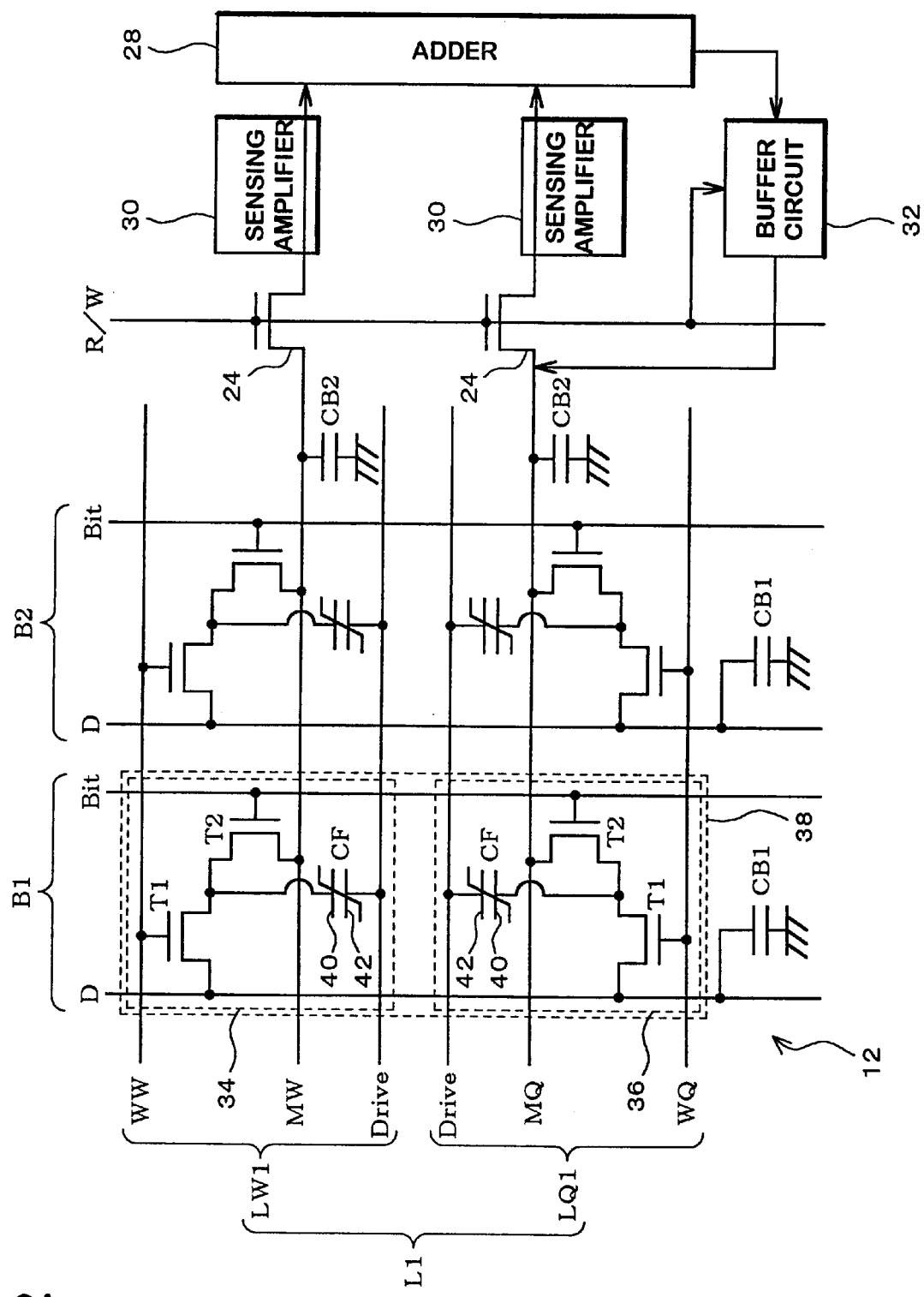
FIG. 2 is a detailed diagram showing a part of the functional memory 10.

As shown in FIG. 2, the rows consist of the W cells 34 form W word portions LW1, LW2, . . . , each of the W word portions functioning as a first word portion. Similarly, the rows consist of the Q cells 36 form Q word portions LQ1, LQ2, . . . , each of the Q word portions functioning a second word portion. One of the W word portions and one of the Q word portions positioned adjacently form word portion pair L. For instance, a word portion pair L1 consists of the W word portion LW1 and the Q word portion LQ1.

Cell pair 38 which forms a memory element pair consist of both the W cell 34 and the Q cell 36 positioned correspondently with each other.

Figure 3:
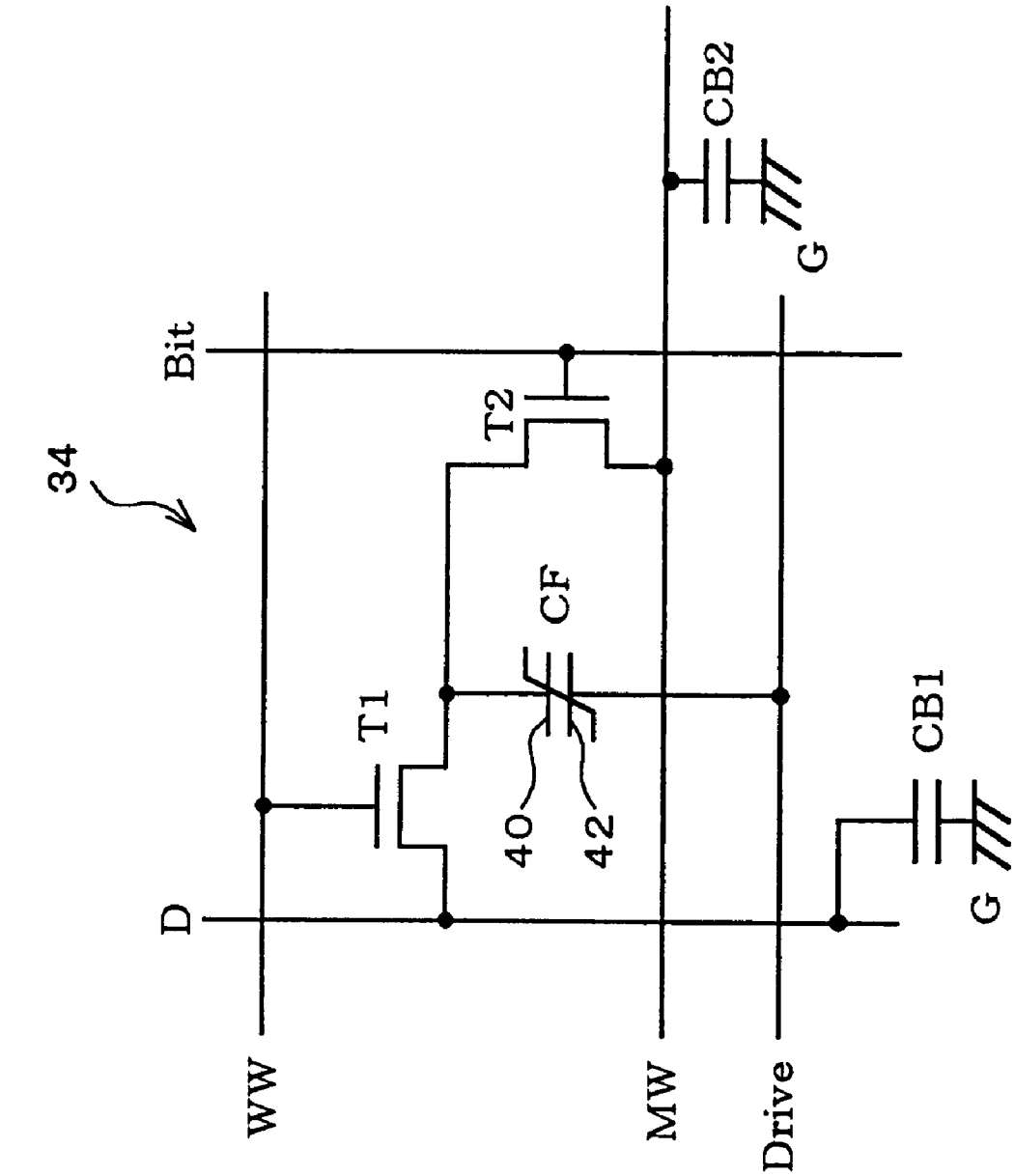
FIG. 3 is a diagram showing the structure of a W cell 34.

FIG. 3 depicts a diagram showing the structure of one of the W cells 34. The W cell 34 includes a ferroelectric capacitor CF. The ferroelectric capacitor CF is formed by interposing a ferroelectric layer made of a ferroelectric material (for example PZT ($PbZr_xTi_{1-x}O_3$)) between two pieces of electrodes. One end 40 of the ferroelectric capacitor CF thus formed is connected to one of data lines D through a transistor T1 which functions as external switching means. A load capacitor CB1 is formed between the data line D and the ground G. The load capacitor CB1 is provided as a parasitic capacitor formed on the data line D in this embodiment. The gate of the transistor T1 is connected to a word line WW.

The one end 40 of the ferroelectric capacitor CF is, also, connected to an inner data line MW through a transistor T2 which functions as internal switching means. Another load capacitor CB2 is provided as a parasitic capacitor formed on the inner data line MW in this embodiment. The gate of the transistor T2 is connected to a bit line Bit.

The other end 42 of the ferroelectric capacitor CF is connected to a driving line Drive.

The structure of the Q cell 36 is similar to that of the W cell 34 excepting that the gate of the transistor T1 is connected to a word line WQ in the Q cell 36. The one end 40 of the ferroelectric capacitor CF is, also, connected to another inner data line MQ through the transistor T2.

Now, referring back to FIG. 1, one desired word portion out of all the W word portions and the Q word portions, is selected by selecting one of the word lines WW and the word lines WQ with the word decoder 14. A desired bit B is selected by selecting one of the data lines D with a data decoder 18. In other words, data received from the outside and that provided thereto is written and is read out to/from one desired cell of the W cells 34 and the Q cells 36 selected by the word decoder 14 and the data decoder 18. At that time, the driver circuit 16 supplies a predetermined voltage to the driving line Drive. The sensing amplifying part 20 is used as both amplification means and rewriting means for reading out data from one desired cell of the W cells 34 and the Q cells 36.

A desired bit B is selected by selecting one of the bit lines Bit with the bit decoder 22. In other words, data processing is carried out internally to the bits belong to all the word portions L1, L2, . . . . selected by the bit decoder 22 (the data processing is hereinafter referred to as internal data processing). At that time, the driver circuit 16 supplies a predetermined voltage to the driving line Drive similar to the abovementioned case in which data received from the outside and that provided thereto is written and is read out.

The inner data lines MW, MQ are connected to the adder 28 through the transistors 24 and sensing amplifiers 30 as shown in FIG. 2. During the internal data processing, the data read out are outputted on the inner data lines, MW, MQ. The sensing amplifier part 30 is used as both amplification means and rewriting means for reading out data from either of the W cell 34 or the Q cell 36. The output of the adder 28 is connected to the inner data line MQ through the buffer circuit 32. A pair of sensing amplifiers 30 and one buffer circuit 32 are provided to each word portion pair. The read/write control part 26 (see FIG. 1) consists of the adders 28 and the buffer circuits 32, both used for all the word portions. The gates of the transistors 24 are connected to a read/write control line R/W.

The outputs of the W cell 34 and the Q cell 36 are sent to the adder 28 through the sensing amplifiers 30 by turning state of the transistors 24 into ON-state with the read/write control line R/W during read-out operation of the internal data processing. The state of the transistors 24 is turned into OFF-state by using the read/write control line R/W during writing operation of the internal data processing. The output of the adder 28 is written to the Q cell 36 through the buffer circuit 32 and the inner data line MQ.

Figure 4:
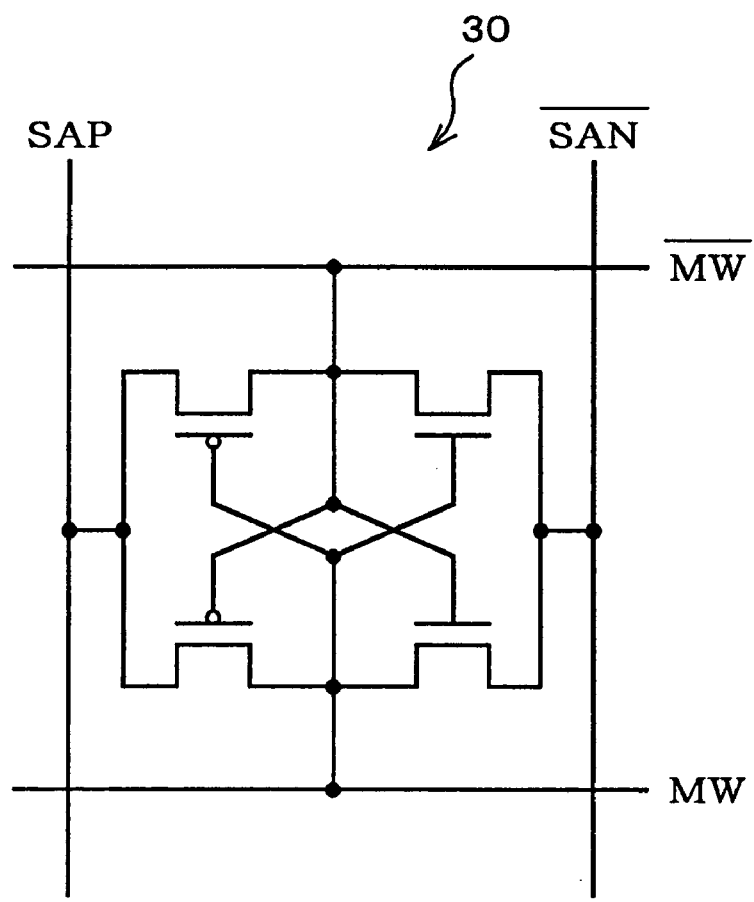
FIG. 4 is a diagram showing an example of the structure of a sensing amplifier 30.

FIG. 4 depicts one example of the structure of the sensing amplifier 30. The sensing amplifier 30 consists of four transistors. Also, the amplifier is connected to the outside at a total of four points. One of the four points is connected to the inner data line MW. Another point is connected to a reference voltage line MWBar (a bar is placed over a reference "MW" in the figure). The reference voltage line MWBar is connected to a dummy cell (not shown) which generates a reference voltage. The remaining two points of the sensing amplifier 30 are connected respectively to a line SAP and a line SANBar (a bar is placed over a reference "SAN" in the figure). The sensing amplifier 30 can be activated by applying an appropriate voltage to the lines SAP, SANBar.

Figure 5:
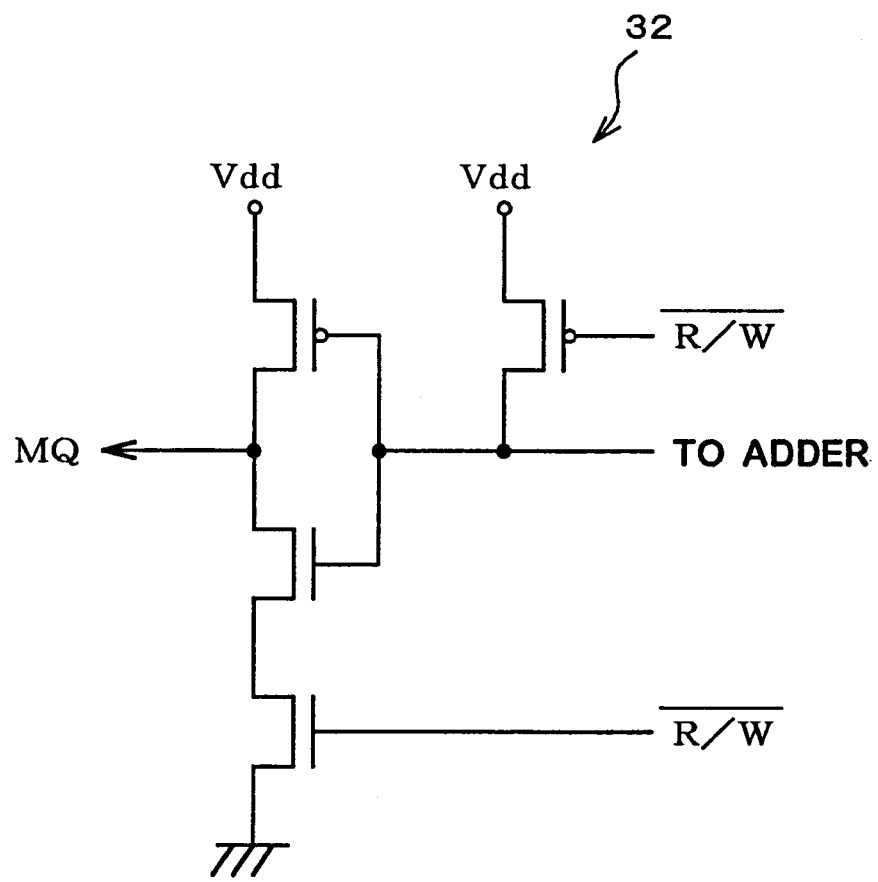
FIG. 5 is a diagram showing an example of the structure of a buffer circuit 32.

FIG. 5 depicts the structure of the buffer circuit 32. The buffer circuit 32 consists of four transistors, and connected to both the output terminal of the adder 28 and the inner data line MQ. A read/write control reverse signal line R/WBar (a bar is placed over a reference "R/W" in the figure) which forms a control input is connected to the circuit.

The inner data line MQ is in a high-impedance state when the signals on the read/write control reverse signal line R/WBar are in "0" (in other words, during the read-out operation of the internal data processing). Conversely, the output of the adder 28 is reversed and is provided to the inner data line MQ when the signals on the read/write control reverse signal line R/WBar are in "1" (in other words, during the writing operation of the internal data processing). The adder 28 is designed to conduct addition so as to comply with increase of figures, and outputs the resultant data with a reversed form.

Figure 6A:
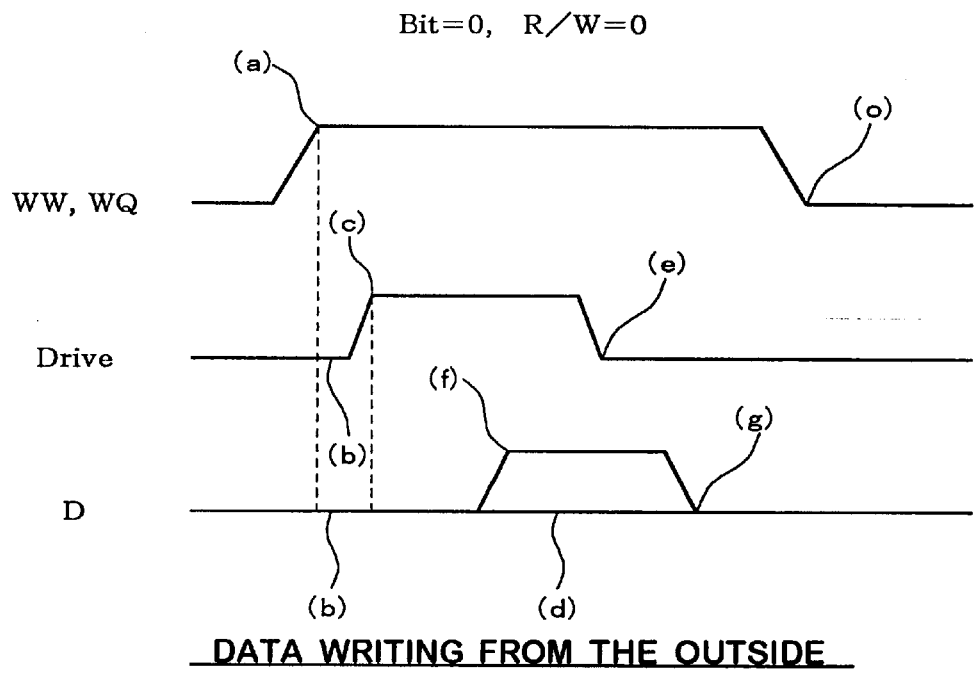
FIG. 6A is a timing chart showing the states of signal lines when data provided from the outside is written.
Figure 6B:
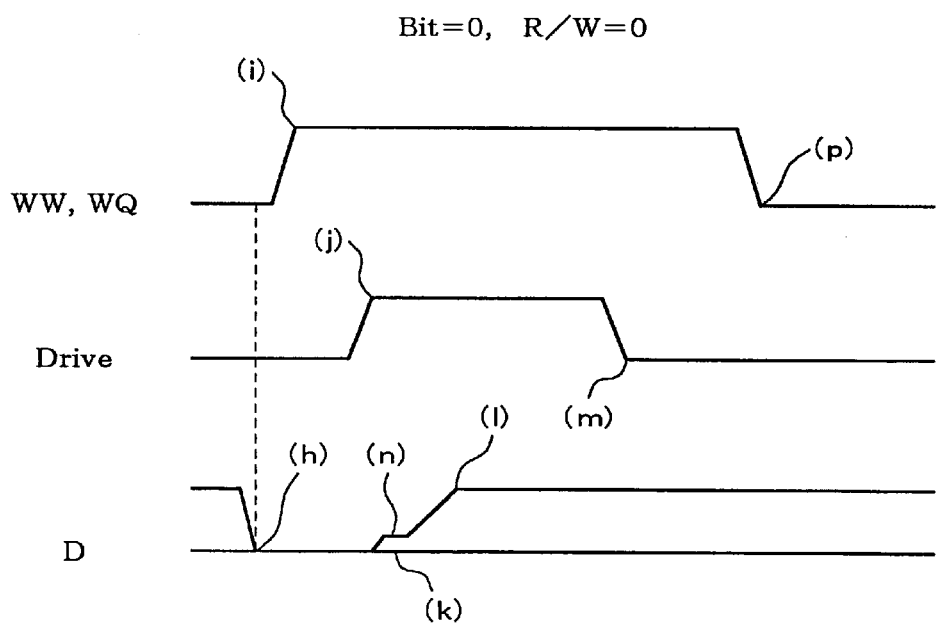
FIG. 6B is a timing chart showing the states of the signal lines when data is read out to the outside.

Next, readout/writing operations of data from/to the functional memory 10 to/from the outside will be described herein. FIG. 6A is a timing chart showing the states of signal lines when data provided from the outside is written. FIG. 6B is a timing chart showing the states of the signal lines when data is read out to the outside.

The writing operation of the data provided from the outside will be described with reference to both FIG. 2 and FIG. 6A. In order to write the data provided from the outside, the states of all the bit lines Bit and all the read/write control line R/W are turned into "0". In this way, both the inner data lines MW, MQ are in the high-impedance state because the states of all the transistors T2 and all the transistors 24 are turned into OFF state.

Under the circumstances, one of the states of the word line WW and the word line WQ which is connected to a desired cell for writing the data therein is turned into "1" (see FIG. 6A, (a)). Hereinafter, it is assumed that the desired cell for writing the data therein (hereinafter referred to as desired cell) is the W cell 34 shown in FIG. 2 for simplicity. The transistor T1 connected to the word line WW is turned into ON-state by turning the state of the word line WW into "1". In this way, the one end 40 of the ferroelectric capacitor CF included in the desired cell is connected to the data line D through the transistor T1. At that time, both ends of the ferroelectric capacitor CF have the same electric potential because the state of the driving line Drive and the data line D are both in "0" (see FIG. 6A, (b)). Therefore, no variation in polarization of the ferroelectric capacitor CF is observed under the circumstances.

Next, the state of the driving line Drive is turned into "1" (see FIG. 6A, (c)). Electric potential of the other end 42 of the ferroelectric capacitor CF comes into "1" by turning the state of the driving line Drive into "1". At that time, the electric potential of the one end 40 of the ferroelectric capacitor CF remains "0". Therefore, a positive voltage relative to the voltage applied to the one end 40 is applied the other end 42 of the ferroelectric capacitor CF.

Figure 9:
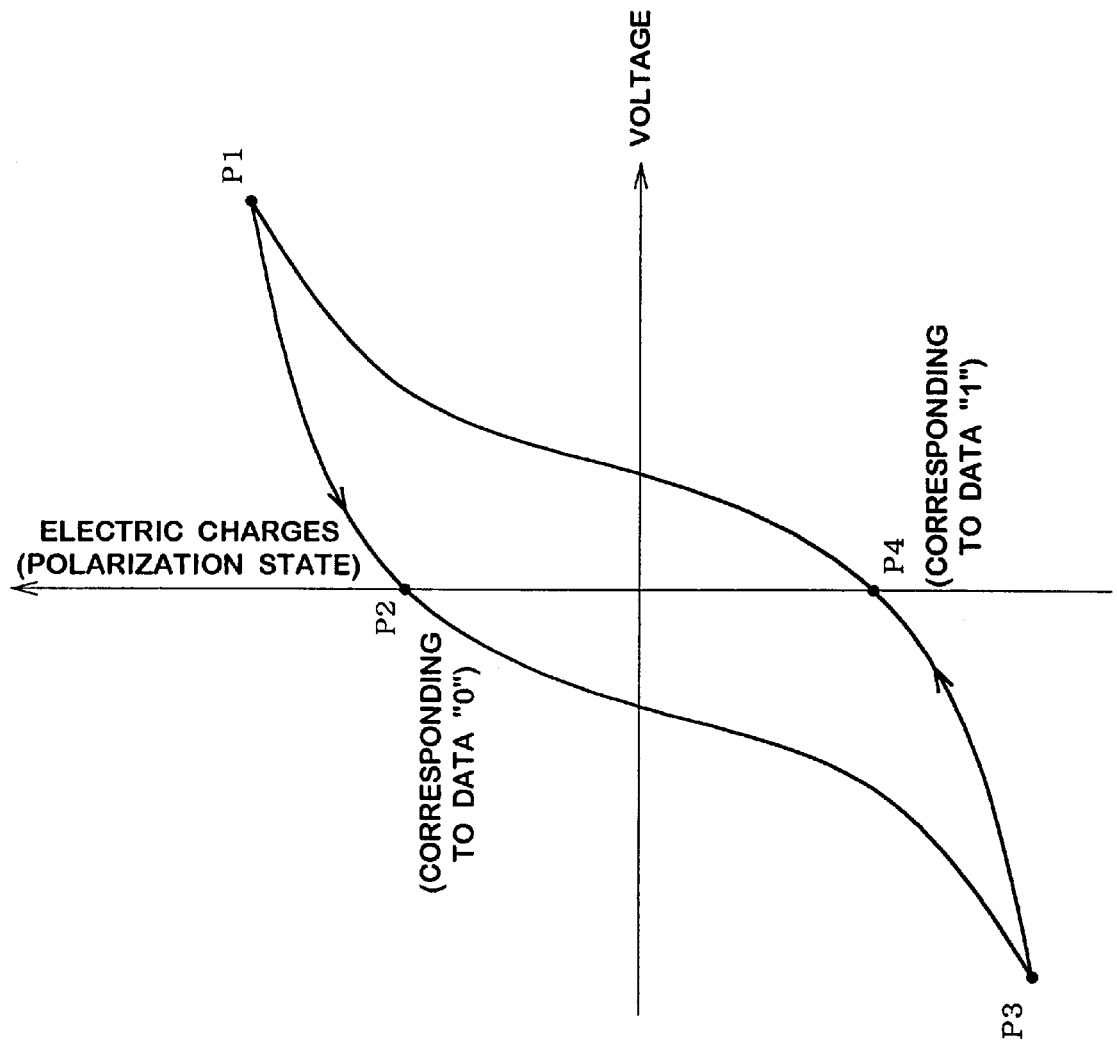
FIG. 9 is a graph showing a relationship between voltages generated in a ferroelectric capacitor CF and electric charges Q charged therein, that is polarization states thereof.

FIG. 9 depicts a graph showing a relationship between voltages generated in a ferroelectric capacitor CF (voltages applied to the other end 42, the voltages are shown in the figure when the voltages applied to the one end 40 are defined as reference voltages) and electric charges charged therein (electric charges, which are charged in the ferroelectric capacitor CF when positive voltages are applied to the other end 42, are defined as positive electric charges), that is polarization states thereof. By applying a positive voltage to the other end 42 of the ferroelectric capacitor CF, the polarization state thereof is in a point P1 as shown in FIG. 9.

In order to write data "0", the data line D needs to maintain its state as "0" (see FIG. 6A, (d)).

Next, the state of the driving line Drive is turned into "0" (see FIG. 6A, (e)). As a result, the electric potential of both ends of the ferroelectric capacitor CF come to the same value again. Therefore, the polarization state of the ferroelectric capacitor CF moves to a point P2 (where corresponding to data "0") shown in FIG. 9.

On the other hand, to write data "1", the data line D needs to turn its state into "1" (see FIG. 6A, (f)). In this way, the electric potential of both ends of the ferroelectric capacitor CF come to the same value. As a result, the polarization state of the ferroelectric capacitor CF once moves to the point P2 shown in FIG. 9.

Further, the state of the driving line Drive is turned into "0" while maintaining the state of the data lines D as "1" (see FIG. 6A, (e)). In this way, a negative voltage relative to the voltage applied to the one end 40 is applied the other end 42 of the ferroelectric capacitor CF. As a result, the polarization state of the ferroelectric capacitor CF moves to a point P3 shown in FIG. 9.

Next, the state of the data line D is turned into "0" (see FIG. 6A (g)). As a result, the electric potential of both ends of the ferroelectric capacitor CF come to the same value again. Therefore, the polarization state of the ferroelectric capacitor CF moves to a point P4 (where corresponding to data "1") shown in FIG. 9.

The transistor T1 is turned into OFF state by turning the state of the word line WW into "0" (see FIG. 6A, (o)) after writing the desired data. In this way, the writing operation is completed by turning the one end 40 of the ferroelectric capacitor CF into a high-impedance state.

Desired data, either of "0" or "1", can be written into a desired cell (into the W cell 34 or the Q cell 36) that is into a desired bit in a desired word portion (into the W word portion or the Q word portion).

Next, the read-out operation of data from the desired cell to the outside will be described with reference to both FIG. 2 and FIG. 6B. In order to read out the data to the outside, the states of all the bit lines Bit and all the read/write control lines R/W are turned into "0" similar to the writing operation. In this way, the state of both the inner data lines MW, MQ are in the high-impedance state because the states of all the transistors T2 and all the transistors 24 are turned into OFF state.

Under the circumstances, the state of the data line D which is connected to a desired cell for reading out the data therefrom, is tuned into "0" (see FIG. 6B, (h)). By turning the state of the data line D into "0", the load capacitor CB1 connected thereto is precharged. Upon completing the precharging, the data line D is maintained in a high impedance state.

Thereafter, one of the states of the word line WW and the word line WQ which is connected to a desired cell for writing the data therein is turned into "1" (see FIG. 6B, (i). Hereinafter, it is assumed that the read out desired cell is the W cell 34 shown in FIG. 2 for simplicity. The transistor T1 connected to the word line WW is turned into ON-state by turning the state of the word line WW into "1". In this way, the load capacitor CB1 thus precharged and the ferroelectric capacitor CF in the read out desired cell are connected in series through the transistor T1.

Next, the state of the driving line Drive is turned into "1" (see FIG. 6B, (j)). By turning the state of the driving line Drive into "1", a predetermined voltage is applied to both ends of the load capacitor CB1 and the ferroelectric capacitor CF both of which connected in series. Electric potential on the data line D having a plurality of contacts with both the load capacitor CB1 and the ferroelectric capacitor CF is varied when the predetermined voltage is applied to the ends. The electric potential on the data line D varies correspondently with the data written in the ferroelectric capacitor CF.

Not much variation of the electric potential on the data line D is detected when the data written in the ferroelectric capacitor CF is "0" (corresponding to the polarization state shown as the point P2 in FIG. 9) (see FIG. 6B, (k)).

Then, a sensing amplifier (not shown) in the sensing amplifying part 20 (see FIG. 1) is activated. The sensing amplifier makes the voltage applied to the data line D to "0" compulsory as a result of a judgement of a variation of the detected voltage on the data line D such that the data stored in the cell is "0". The data "0" written in the cell can be detected by reading out the resultant data of the judgement.

The polarization state of the ferroelectric capacity CF moves to the point P1 shown in FIG. 9 by compulsory making the voltage applied to the data line D to "0". Then, the polarization state of the ferroelectric capacity CF moves to the point P2 by turning back the state of the driving line Drive into "0" (see FIG. 6B, (m)). Thus, data "0" equivalent to the data once read out from the cell is written thereto again. These steps are referred to as rewriting operation.

On the other hand, a slight variation of the electric potential on the data line D is detected when the predetermined voltage is applied to the load capacitor CB1 and the ferroelectric capacitor CF storing data "1" therein (corresponding to the polarization state shown as the point P4 in FIG. 9) both of which are connected in series (see FIG. 6B (n)).

Therefore, the sensing amplifier in the sensing amplifying part 20 (see FIG. 1) makes the voltage applied to the data line D to "1" compulsory as a result of a judgement of a variation of the detected voltage on the data line D such that the data stored in the cell is "1" (see (1) in FIG. 6B). The data "1" written in the cell can be detected by reading out the result of the judgement.

The polarization state of the ferroelectric capacitor CF moves to the point P3 by turning back the state of the driving line Drive into "0" while compulsory maintaining the voltage applied to the data line D to "1" (see FIG. 6B, (m)). Thus, the data "1" equivalent to the data once read out from the cell is again written thereto.

Upon completion of the read-out operation and the rewriting operation, the transistor T1 is turned into OFF-state by turning the state of the word line WW into "0" (see FIG. 6B, (p)). In this way, the read-out operation is completed by turning the one end 40 of the ferroelectric capacitor CF into a high-impedance state.

Figure 7A:
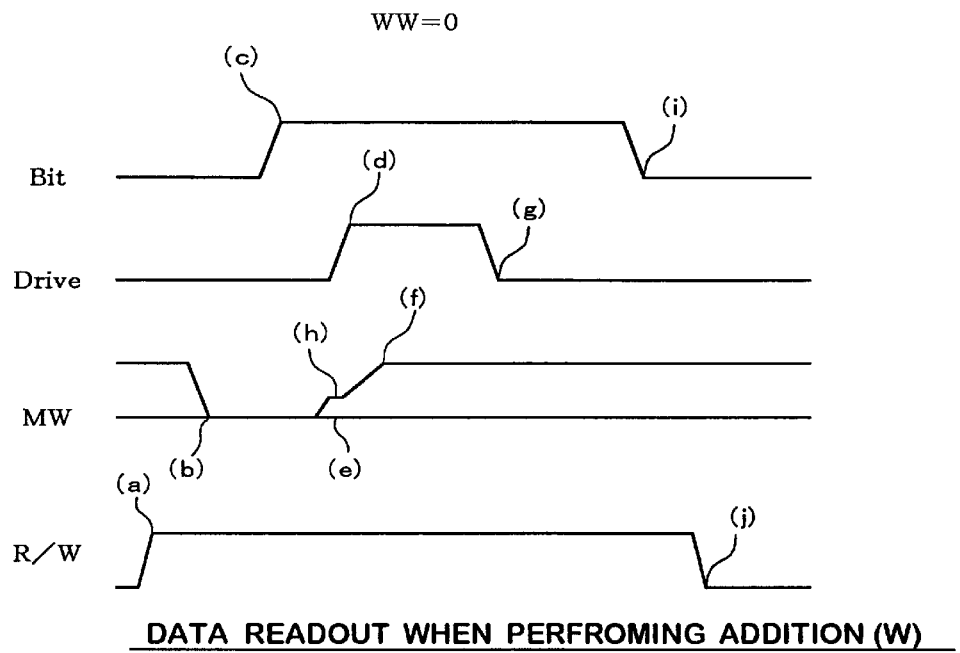
FIG. 7A is a timing chart showing the states of signal lines when data is read out from the W cell 34 in the case of performing addition internally.
Figure 7B:
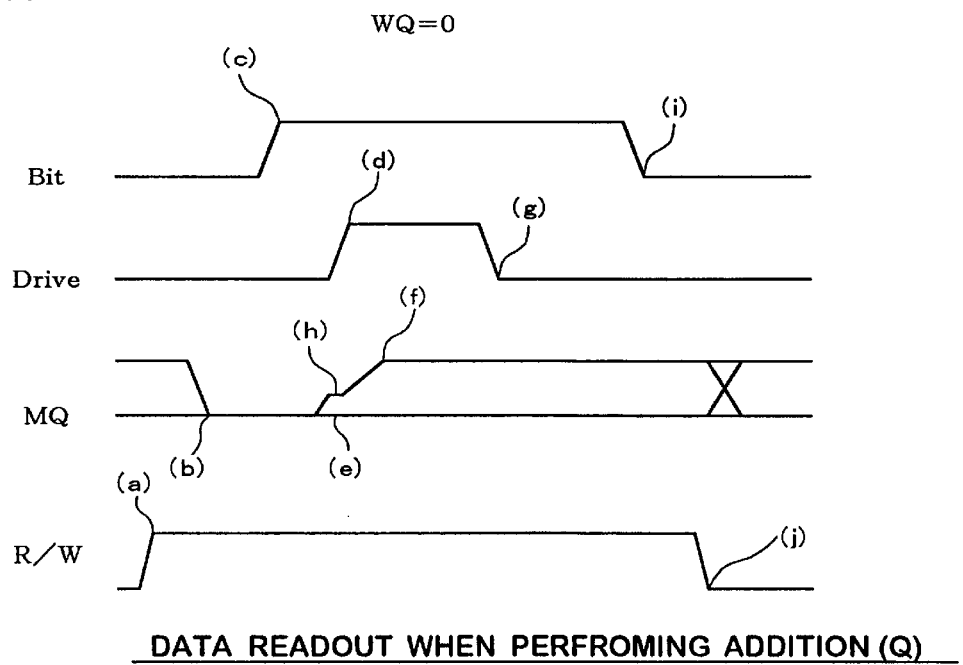
FIG. 7B is a timing chart showing the states of signal lines when data is read out from a Q cell 36 in the case of performing addition internally.
Figure 8:
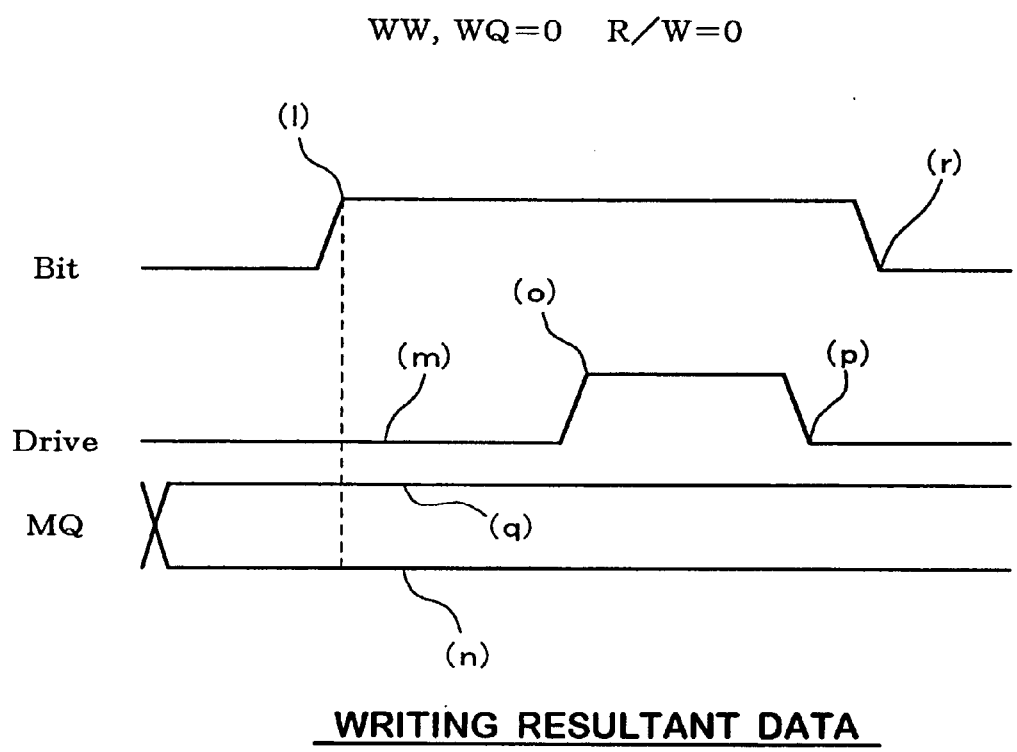
FIG. 8 is a timing chart showing the states of signal lines when resultant data of the addition is written to the Q cell 36 in the case of performing the addition internally.

Next, addition preformed within the functional memory 10 will be described herein. FIG. 7A is a timing chart showing the states of signal lines when data is read out from the W cell 34 in the case of performing addition internally. FIG. 7B is a timing chart showing the states of signal lines when data is read out from a Q cell 36 in the case of performing addition internally. FIG. 8 is a timing chart showing states of signal lines when resultant data of the addition is written to the Q cell 36 in the case of performing addition internally.

Steps for performing the addition within the functional memory 10 may be considered as two separate groups, one of which consist of steps for reading out data from both the W cell 34 and the Q cell 36 as well as carrying out the addition for both data thus read out, and the other one is steps for writing the resultant data of the addition to the Q cell 36.

Details of the steps for reading out data from both the W cell 34 and the Q cell 36 as well as carrying out the addition will be described with reference to FIG. 2, FIG. 7A and FIG. 7B. In order to carry out the addition internally, the states of all the word lines WW, WQ are turned into "0". In this way, all the data lines D are electrically isolated from the cells because the states of all the transistors T1 are turned into OFF state.

The steps for reading out data from W cell 34 and that from the Q cell 36 are performed in parallel manner. At first, the state of the read/write control line R/W is turned into "1" (see FIG. 7A, FIG. 7B (a)). In this way, all the inner data lines MW, MQ are connected to the sensing amplifiers 30 and the adders 28 through the transistors 24 because the states of all the transistors 24 are turned into ON-state.

Next, the state of all the inner data lines MW, MQ are turned into "0" (see FIG. 7A, FIG. 7B (b)). By turning the state of all the inner data lines MW, MQ into "0", all the load capacitors CB2 connected to the inner data lines MW, MQ are precharged. Upon completing the precharging, the states of the inner data lines MW, MQ are maintained in a high impedance state.

Thereafter, the state of the bit line Bit connected to a cell composing a desired bit for carrying out addition (hereinafter referred to as addition desired bit), is tuned into "1" (see FIG. 7A, FIG. 7B, (c)). Hereinafter, it is assumed that the addition desired bit is the B1 shown in FIG. 2 for simplicity. Although, simultaneous addition is performed over a plurality of the word portions L1, L2 . . . . , only the addition performed at the first word portion L1 will be described herein.

By turning the state of the bit line Bit into "1", the transistors T2 connected thereto are turned into ON-state. In this way, the load capacitors CB2 thus precharged and the ferroelectric capacitors CF in the cell composing the addition desired bit are respectively connected in series through the transistor T2.

Next, the state of the driving line Drive is turned into "1" (see FIG. 7A, FIG. 7B, (d)). By turning the state of the driving line Drive into "1", a predetermined voltage is applied to both ends of the load capacitor CB2 and the ferroelectric capacitor CF both connected in series. Upon applying the predetermined voltage, electric potentials on the inner data lines MW, MQ, each having contacts with both the load capacitor CB2 and the ferroelectric capacitor CF are varied respectively. The electric potentials on the inner data lines MW, MQ vary correspondently with the data written in the ferroelectric capacitors CF.

Not much variation of the electric potentials on the inner data line MW (MQ) is detected when the data written in the ferroelectric capacitor CF (corresponding to the polarization state shown as the point P2 in FIG. 9) is "0" (see FIG. 7A, FIG. 7B (e)).

Thereafter, the sensing amplifier 30 is activated. The sensing amplifier 30 makes the voltage applied to the inner data line MW (MQ) to "0" compulsory as a result of a judgement of a variation of electric potentials on the inner data line MW (MQ) such that the data written is "0". The adder 28 obtains the resultant data of the judgement from pair of the sensing amplifiers 30.

Polarization state of the ferroelectric capacitor CF moves to the point P1 shown in FIG. 9 by compulsory making the voltage applied to the inner data line MW (MQ) to "0". Then, the polarization state of the ferroelectric capacitors CF moves to the point P2 by turning back the state of the driving line Drive into "0" (see FIG. 7A, FIG. 7B, (g)). Thus, data "0" equivalent to the data once read out from the cell is again written thereto.

On the other hand, a slight variation of the electric potential on the inner data line MW (MQ) is detected when the predetermined voltage is applied to both ends of the load capacitor CB2 and the ferroelectric capacitor CF storing data "1" therein (corresponding to the polarization state shown as the point P4 in FIG. 9), both of which are connected in series (see FIG. 7A, FIG. 7B (h)).

Therefore, the sensing amplifier 30 makes the voltage applied to the inner data line MW (MQ) to "1" compulsory as a result of a judgement of a variation of electric potential on the inner data line MW (MQ) such that the data being written is "1" (see FIG. 7A, FIG. 7B, (f)). The adder 28 obtains the resultant data of the judgement from pair of the sensing amplifiers 30.

Polarization state of the ferroelectric capacitor CF moves to the point P3 by turning the state of the driving line Drive into "0" while maintaining the state of the inner data line MW (MQ) to "1" compulsory (see FIG. 7A, FIG. 7B, (g)). Thus, data "1" equivalent to the data once read out from the cell is again written thereto.

Upon completion of the read-out operation and the rewriting operation, the transistors T2 are turned into OFF-state by turning the state of the bit line Bit into "0" (see FIG. 7A, FIG. 7B, (i)). As a result, the one ends 40 of the ferroelectric capacitors CF are turned into a high-impedance state.

Next, the state of the read/write control line R/W is turned back to "0" (see FIG. 7A, FIG. 7B, (j)). In this way, the inner data line MW is turned into high impedance state because the transistor 24 is turned into OFF-state. In addition, the resultant data of the addition outputted by the adder 28 is provided to the inner data line MQ through the buffer circuit 32 as described above because the state of the read/write control reverse signal line R/WBar is turned into "1" (see FIG. 7A, FIG. 7B, (k)).

Thereafter, writing operation of the resultant data provided to the inner data line MQ into the Q cell 36 will be described with reference to Fig, 2 and FIG. 8. Following to the steps for reading out data from both the W cell 34 and the Q cell 36 as well as carrying out the addition of the data, the states of the word lines WW, WQ and the read/write control line R/W are remained "0". Also, the resultant data of the addition outputted by the adder 28 is provided to the inner data line MQ as described above. Conversely, the state of the inner data line MW comes into high-impedance state.

The state of the bit line Bit is turned into "1" under the circumstances stated above (see FIG. 6, (1)). By turning the state of the bit line Bit into "1", the transistors T2 connected thereto are turned into ON-state. In this way, the one ends 40 of the ferroelectric capacitors CF are connected to the inner data lines MW, MQ through the transistors T2. At that time, the data which is stored in the W cell 34 connected to the inner data line MW, is unchanged regardless of the state of the driving line because the inner data line MW is in high-impedance state.

Conversely, the data which is stored in the Q cell 36 connected to the inner data line MQ, is revised correspondently with the resultant data of the addition because the resultant data outputted by the adder 28 is provided to the inner data line MQ.

The writing operation of the resultant data its value being in "0" will be described. In this operation, electric potential of both ends of the ferroelectric capacitor CF in the Q cell 36 comes into the same value because the state of the driving line Drive and that of the inner data line MQ are in "0" (see FIG. 8, (m), (n)). In this way, the polarization state of the ferroelectric capacitor CF is unchanged under the circumstances.

Next, the state of the driving line Drive is turned into "1" (see FIG. 8, (o)). By turning the driving line Drive into "1", the state of the other end 42 of the ferroelectric capacitor CF is turned into "1". At that time, the one end 40 of the ferroelectric capacitor CF remains its state "0". Therefore, a positive voltage relative to the voltage applied to the one end 40 is applied the other end 42 of the ferroelectric capacitor CF.

By applying the positive voltage to the other end 42 of the ferroelectric capacitor CF, the polarization state thereof moves to the point P1 as shown in FIG. 9. Then, the state of the driving line Drive is turned into "0" (see FIG. 8 (p)). As a result, the electric potential of both ends of the ferroelectric capacitor CF come to the same value again. Therefore, the polarization state of the ferroelectric capacitor CF moves to a point P2 (where corresponding to data "0") shown in FIG. 9.

On the other hand, the state of the driving line Drive and that of the inner data line MQ are in "0" and "1" respectively when the resultant data is in "1" (see FIG. 8, (m), (q)). Therefore, a negative voltage relative to the voltage applied to the one end 40 is applied the other end 42 of the ferroelectric capacitor CF. As a result, the polarization state of the ferroelectric capacitor CF moves to the point P3 shown in FIG. 9.

Next, the state of the driving line Drive is turned into "1" (see FIG. 8, (o)). In this way, the electric potential of both ends of the ferroelectric capacitor CF come to the same value again. Therefore, the polarization state of the ferroelectric capacitor CF moves to the point P4 (where corresponding to data "1") shown in FIG. 9.

Further, the polarization state of the ferroelectric capacitor CF moves to the point P3 again by turning the state of the driving line Drive into "0" (see FIG. 8, (p)). However, as the time progresses, the polarization state of the ferroelectric capacitor CF will move to the point P4 shown in FIG. 9 as a result of discharging a part of the electric charges therefrom by leaving the ferroelectric capacitor CF under the high-impedance state.

The state of the transistors T2 is turned into OFF-state by turning the state of the bit line Bit into "0" (see FIG. 8, (r)) after writing the resultant data provided to the inner data line MQ into the Q cell 36. In this way, the one end 40 of the ferroelectric capacitor CF can be turned into a high-impedance state.

Thus, simultaneous addition to desired bit over a plurality of word portions L1, L2, . . . can be performed in parallel manner. In order to perform the addition to all the bits, sequential addition and a thorough shifting over the bits are required.

One adder is provided to every word portion pair in the embodiments described above, the number and/or arrangement of the adder is not limited to these embodiments. For example, it is possible to provide one adder to every bit. Also, one adder may be provided to the memory element pair. Further, just one adder may be provided to the entire functional memory.

Although, adders are used as the internal data processing means in the embodiments described above, the internal data processing means is not limited to the adders. Other means for performing mathematical calculations such as a multiplier(s), or a logic unit(s), or shifting means and the like may be used for the internal data processing means.

Though, resultant data of a predetermined processing is written to the second memory element after carrying out the predetermined processing to the data read out from both the first element and the second element in the embodiments described earlier, it is not limited to follow the way described above. For example, the present invention may be realized by writing the resultant data to a third memory element after carrying out the predetermined processing to the data read out from both the first element and the second element. Alternatively, the present invention may also be realized by writing the resultant data to the second memory element by carrying out a predetermined processing in which the data stored in the first memory element is squared. The present invention may further be realized by writing a resultant data back to the first memory element by carrying out a predetermined processing in which the data stored in the first memory element is squared.

Figure 10:
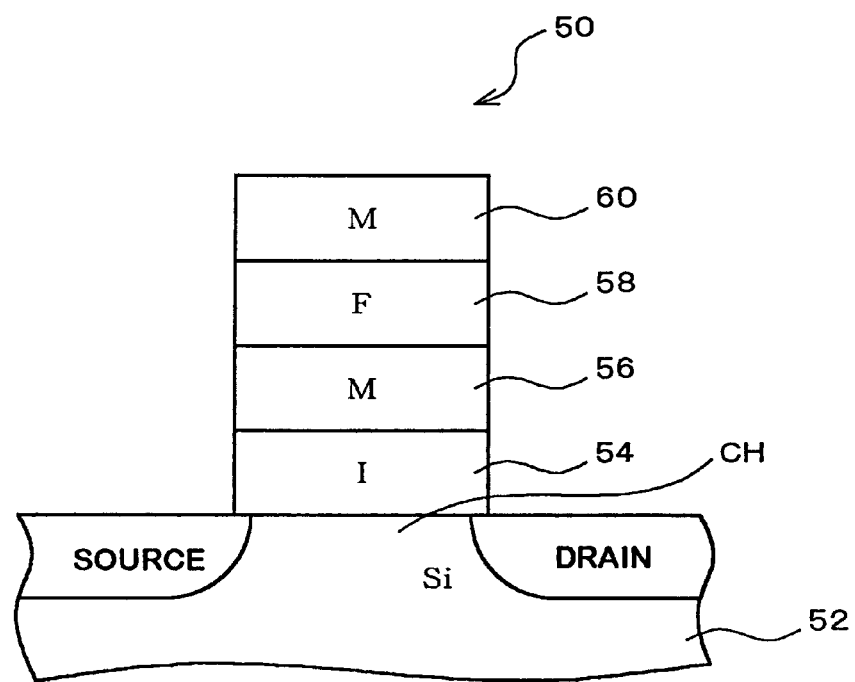
FIG. 10 is a diagram showing a field effect transistor (hereinafter referred to as FET) 50 used as a memory element according to another embodiment of the present invention.

Although, the memory elements, each having a ferroelectric capacitor and a load capacitor connected to the ferroelectric capacitor in series, are used in the embodiments described earlier, the memory elements are not limited to the structure. Field effect transistors (FET's) using a ferroelectric layer, one example of which is shown in FIG. 10, may be used as the memory elements. The FET 50 shown in FIG. 10, is called an FET having the structure of Metal Ferroelectric Metal Insulator Silicon (MFMIS), and which is produced by forming a gate oxidation layer 54, a floating gate 56, a ferroelectric layer 58, and a control gate 60 on a channel formation region CH of a semiconductor substrate 52 in that order.

The ferroelectric layer 58 causes polarization reversal when a positive voltage +V is applied to the control gate 60 while grounding the substrate 52 (N channel) of the FET 50. Negative electric charges are generated in the channel formation region CH even when no more voltage is applied to the control gate 60 because of remanent polarization in the ferroelectric layer 58. The state described above is defined as "1" state.

Conversely, the ferroelectric layer 58 causes polarization reversal in the opposite polarity when a negative voltage −V is applied to the control gate 60. Positive electric charges are generated in the channel formation region CH even when no more voltage is applied to the control gate 60 because of the remanent polarization in the ferroelectric layer 58. The state described above is defined as "0" state. Thus, data (either of "1" or "0") is written to the FET 50.

In order to read out the data thus written therein, a read out voltage Vr is applied to the control gate 60. The read out voltage Vr is set at a value between a threshold voltage $V_{th1}$ of the FET 50 and another threshold voltage $V_{th0}$ of the FET 50 corresponding respectively to the "1" state and the "0" state. In this way, distinction of the data being written, either of "1" or "0", can be made by detecting whether or not a predetermined drain current flows when the read out voltage Vr is applied to the control gate 60. In addition, there is no probability to erase the data being written during the reading out.

As described above, a read-out operation so called non-destructive read-out can be carried out by utilizing the FET which includes the ferroelectric layer. Consequently, there is no probability to destroy the data being written once during the read-out operation. Therefore, the read-out operation can be carried out at a high speed. Further, the power consumption may be decreased. In addition, the reliability of the data storing can further be increased because not much degradation of the ferroelectric layer is observed.

The present invention is characterized in that, a ferroelectric memory element which stores data by using hysteresis characteristics of ferroelectrics is used as the memory element.

In other words, it is not necessary to carry out the refreshing operation as well as related operations thereto because the ferroelectric memory element is a nonvolatile memory element. In this connection, the number of transistors as well as wirings connecting therebetween both used for the device may be decreased. Further, the read-out/writing operations and the rewriting operation as well as the predetermined processing can be carried out with simple operations. In addition, there is no probability to erase the data under processing undesirably even when the power supply is in a trouble.

Also, the present invention is characterized in that, the device comprises external switching means and internal switching means.

Therefore, data can be written and read out to/from the memory element by turning the external switching means into "ON" state and the internal switching means into "OFF" state. Further, a predetermined processing to the data stored in the memory element using the internal data processing means can be carried out by turning the external switching means into "OFF" state and the internal switching means into "ON" state.

Further, the present invention is characterized in that, the internal data processing means writes resultant data of a predetermined processing performed to the memory element after carrying out the predetermined processing to data read out from the memory element when the internal switching means is in ON-state.

In this way, the resultant data of the predetermined processing can be stored in the memory element after performing the predetermined processing to the data stored in the memory element without making any access to the memory element from the outside of the device. As a result, the resultant data can be stored while performing the predetermined data processing within the memory device.

The present invention is characterized in that, the device comprises read/write state switching means and a buffer circuit, wherein the internal switching means and the read/write state switching means are turned into ON-state when data stored in the memory element is read out and sent to the internal data processing means, and wherein the internal switching means is turned into ON-state while turning the read/write state switching means into OFF-state when the resultant data is written into the memory element, and wherein the resultant data is written into the memory element by using the buffer circuit.

Consequently, the data stored in the memory element can reliably be read out to the internal data processing means through the internal switching means and the read/write state switching means, and the resultant data can reliably be written to the memory element through the buffer circuit and the internal switching means.

Also, the present invention is characterized in that, a first memory element and a second memory element are provided as the memory element, and wherein the internal data processing means reads out data stored in the first memory element and the second memory element, and wherein the processing means performs a predetermined processing, and wherein the processing means writes resultant data of the processing into the second memory element.

In this way, the device formed under the present invention is preferred because the number of the memory elements can be reduced when generation of new data as a result of performing a data processing to two different data is needed while at least one of the original data is unnecessary.

Further, the present invention is characterized in that, a plurality of the first memory elements are arranged as a first word portion, and wherein a plurality of the second memory elements are arranged as a second word portion, and wherein one internal data processing means is provided to each word portion pair composed of the first word portion and the second word portion, and wherein the processing is performed under memory element pair basis which is composed of a pair of memory elements belong to the word portion pair, the memory elements being positioned correspondently with each other, and wherein the processing to a plurality of word portion pair is performed simultaneously in parallel manner.

In this manner, the processing to a plurality of the word portion pair is performed under serial manner in the bit direction as well as parallel manner in the word direction. As a result, a large scaled data processing can be performed at a high speed.

The present invention is characterized in that, the internal data processing means is an adder.

Therefore, it is especially preferred for image data processing which requires a simple processing in a large scale under the real-time basis.

Also, the present invention is characterized in that, the memory element includes a ferroelectric capacitor and a load capacitor connected in series with the ferroelectric capacitor.

In this way, the structure of the memory element can be simplified. As a result, the profile of the memory element can be lowered.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A memory device with processing function, the memory device comprising:
   a memory element for storing data, and
   internal data processing means for performing a processing predetermined other than data read/writing processing to the data stored in the memory element, wherein a ferroelectric memory element which stores data by using hysteresis characteristics of ferroelectrics is used as the memory element.

2. The memory device in accordance with claim 1 which further comprises:

external switching means for controlling data reception/ transmission between outside of the device and the memory element, and internal switching means for controlling data reception/ transmission between the internal data processing means and the memory element.

3. The memory device in accordance with claim 2, wherein the internal data processing means writes resultant data of the predetermined processing performed to the memory element after carrying out the predetermined processing to data read out from the memory element when the internal switching means is in ON-state.

4. The memory device in accordance with claim 3 which further comprises:

read/write state switching means arranged in a signal path formed between the memory element and the internal data processing means so as to be connected in series with the internal switching means, and a buffer circuit for writing the resultant data into the memory element, wherein the internal switching means and the read/write state switching means are turned into ON-state when data stored in the memory element is read out and sent to the internal data processing means, and wherein the internal switching means is turned into ON-state while turning the read/write state switching means into OFF-state when the resultant data is written into the memory element, and wherein the resultant data is written into the memory element by using the buffer circuit.

5. The memory device in accordance with claim 3, wherein a first memory element and a second memory element are provided as the memory element, and wherein the internal data processing means reads out data stored in the first memory element and the second memory element, and wherein the internal data processing means performs the predetermined processing, and wherein the processing means writes resultant data of the processing into the second memory element.

6. The memory device in accordance with claim 5, wherein a plurality of the first memory elements are arranged as a first word portion, and wherein a plurality of the second memory elements are arranged as a second word portion, and wherein one internal data processing means is provided to each word portion pair composed of the first word portion and the second word portion, and wherein the predetermined processing is performed under memory element pair basis which is composed of a pair of memory elements belong to the word portion pair, the memory elements being positioned correspondently with each other, and wherein the processing to a plurality of word portion pairs is performed simultaneously in parallel manner.

7. The memory device in accordance with claim 3, wherein the internal data processing means is an adder.

8. The memory device in accordance with claim 1, wherein the memory element includes a ferroelectric capacitor and a load capacitor connected in series with the ferroelectric capacitor.

9. The memory device in accordance with claim 2, wherein the memory element includes a ferroelectric capacitor and a load capacitor connected in series with the ferroelectric capacitor.

10. The memory device in accordance with claim 4, wherein a first memory element and a second memory element are provided as the memory element, and wherein the internal data processing means reads out data stored in the first memory element and the second memory element, and wherein the internal data processing means performs the predetermined processing, and wherein the processing means writes resultant data of the processing into the second memory element.

11. The memory device in accordance with claim 4, wherein the internal data processing means is an adder.

12. The memory device in accordance with claim 4, wherein the memory element includes a ferroelectric capacitor and a load capacitor connected in series with the ferroelectric capacitor.

13. The memory device in accordance with claim 10, wherein a plurality of the first memory elements are arranged as a first word portion, and wherein a plurality of the second memory elements are arranged as a second word portion, and wherein one internal data processing means is provided to each word portion pair composed of the first word portion and the second word portion, and wherein the predetermined processing is performed under memory element pair basis which is composed of a pair of memory elements belong to the pair word portion pair, the memory elements being positioned correspondently with each other, and wherein the processing to a plurality of word portion pairs is performed simultaneously in parallel manner.

14. The memory device in accordance with claim 10, wherein the internal data processing means is an adder.

15. The memory device in accordance with claim 10, wherein the memory element includes a ferroelectric capacitor and a load capacitor connected in series with the ferroelectric capacitor.

16. The memory device in accordance with claim 13, wherein the internal data processing means is an adder.

17. The memory device in accordance with claim 13, wherein the memory element includes a ferroelectric capacitor and a load capacitor connected in series with the ferroelectric capacitor.

18. The memory device in accordance with claim 5, wherein the internal data processing means is an adder.

19. The memory device in accordance with claim 6, wherein the internal data processing means is an adder.

20. The memory device in accordance with claim 3, wherein the memory element includes a ferroelectric capacitor and a load capacitor connected in series with the ferroelectric capacitor.

* * * * *